United States Patent
Kasai et al.

(10) Patent No.: US 9,640,388 B2
(45) Date of Patent: May 2, 2017

(54) METHOD FOR FORMING INSULATING FILM AND METHOD FOR MANUFACTURING SEMICONDUCTOR DEVICE

(71) Applicant: TOKYO ELECTRON LIMITED, Tokyo (JP)

(72) Inventors: Shigeru Kasai, Yamanashi (JP); Kotaro Miyatani, Yamanashi (JP); Takuya Kurotori, Tokyo (JP); Kenichi Kote, Yamanashi (JP); Yutaka Fujino, Yamanashi (JP); Akira Tanihara, Yamanashi (JP); Kohei Kawamura, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/043,242

(22) Filed: Feb. 12, 2016

(65) Prior Publication Data
US 2016/0240374 A1 Aug. 18, 2016

(30) Foreign Application Priority Data
Feb. 13, 2015 (JP) .................................. 2015-026315

(51) Int. Cl.
*H01L 21/00* (2006.01)
*H01L 21/02* (2006.01)

(52) U.S. Cl.
CPC .. *H01L 21/02345* (2013.01); *H01L 21/02175* (2013.01); *H01L 21/02274* (2013.01)

(58) Field of Classification Search
CPC ......... H01L 21/28556; H01L 21/76831; H01L 21/76843; H01L 21/76849; H01L 21/02345; H01L 21/02274; H01L 21/02175
See application file for complete search history.

(56) References Cited

U.S. PATENT DOCUMENTS

2002/0119651 A1* 8/2002 Noguchi ........... H01L 21/02063
438/618
2010/0068880 A1* 3/2010 Hatanaka ................ C23C 16/30
438/627

FOREIGN PATENT DOCUMENTS

JP 2012-74608 4/2012

* cited by examiner

*Primary Examiner* — Richard Booth

(57) ABSTRACT

In a method for forming a fluorocarbon-based insulating film to be in contact with a metal, a microwave is irradiated to the metal to which moisture is adhered in a hydrogen-containing atmosphere. Then plasma CVD using a fluorocarbon-based gas is performed on the metal to which the microwave is irradiated to form the insulating film.

19 Claims, 4 Drawing Sheets

METHOD FOR FORMING INSULATING FILM AND METHOD FOR MANUFACTURING SEMICONDUCTOR DEVICE

CROSS-REFERENCE TO RELATED APPLICATIONS

This application claims priority to Japanese Patent Application No. 2015-026315 filed on Feb. 13, 2015, the entire contents of which are incorporated herein by reference.

FIELD OF THE INVENTION

The disclosure relates to a method for forming an insulating film and a method for manufacturing a semiconductor device; and more particularly, to a method for forming a low-k insulating film to be in contact with a metal wiring and a method for manufacturing a semiconductor device.

BACKGROUND OF THE INVENTION

In a semiconductor device having multilayer interconnection such as LSI (large-scale integration) or the like, a low-k insulating film is often used as an interlayer insulating film between metal wirings. As for the low-k insulating film, a SiCO film having a dielectric constant of about 2.6 is used (see, e.g., Japanese Patent Application Publication No. 2012-74608).

The SiCO film has a porous structure and a high hygroscopic property. Therefore, in the case of using the SiCO film as the low-k insulating film, the low-k insulating film may absorb moisture and deteriorate. In order to prevent the SiCO film from absorbing moisture, the surface of the SiCO film is covered by an etching stop film such as a SiC film, a SiCN film or the like. Since, however, SiC or SiCN has a high dielectric constant of about 4 to 5, the dielectric constant of the entire interlayer insulating film including the SiCO film and the etching stop film is also increased.

To that end, recently, a CF (fluorocarbon) film is used as the low-k film. The CF film hardly absorbs moisture and has a low dielectric constant of about 2.2. Therefore, it is not required to cover the surface of the CF film by the etching stop film. As a result, it is possible to suppress the increase of the dielectric constant of the entire interlayer insulating film.

In the semiconductor device, the interlayer insulating film is formed to be in contact with a metal wiring, e.g., a copper wiring. In the case of using the CF film as the interlayer insulating film, the CF film is formed by plasma CVD using a CF-based gas. A physical adsorption force of moisture to copper is strong and, thus, moisture 41 exists on a copper wiring 40 during the plasma CVD (see FIG. 4A). Copper reacts with the moisture 41, fluorine radical in the plasma generated from the CF-based gas, and oxygen in an atmosphere. As a result, the surface of the copper wiring 40 is fluorinated and a fluoride 42 is generated (see FIG. 4B). The fluoride 42 increases a resistance of the copper wiring 40 and causes peeling off of the copper wiring 40 and the interlayer insulating film 43 (see FIG. 4C).

In order to suppress the formation of the fluoride, the moisture on the copper wiring is removed by heating a semiconductor wafer having semiconductor devices formed thereon using a heater or the like before the interlayer insulating film is formed.

However, in the case of evaporating the moisture on the copper wiring by heating the semiconductor wafer by the heater, the entire semiconductor wafer is heated by the heater. Therefore, the heating efficiency for removing the moisture is poor and it takes a long time, e.g., 15 minutes or more to remove the moisture. As a result, a throughput is decreased.

SUMMARY OF THE INVENTION

In view of the above, the disclosure provides a method for forming an insulating film which can suppress peeling off of the insulating film and improve a throughput in case of removing moisture by heating, and a method for manufacturing a semiconductor device.

In accordance with an aspect of the disclosure, there is provided a method for forming a fluorocarbon-based insulating film to be in contact with a metal, the method including irradiating a microwave to the metal to which moisture is adhered in a hydrogen-containing atmosphere, and performing plasma CVD using a fluorocarbon-based gas on the metal to which the microwave is irradiated to form the insulating film.

In accordance with another aspect of the disclosure, there is provided a method for manufacturing a semiconductor device having a fluorocarbon-based insulating film to be in contact with a metal, the method including irradiating a microwave to the metal to which moisture is adhered in a hydrogen-containing atmosphere, and performing plasma CVD using a fluorocarbon-based gas on the metal to which the microwave is irradiated to form the insulating film.

BRIEF DESCRIPTION OF THE DRAWINGS

The objects and features of the disclosure will become apparent from the following description of embodiments, given in conjunction with the accompanying drawings, in which:

FIGS. 3A to 3C are top views of a semiconductor wafer, wherein FIG. 3A shows a result of a peel test using a tape for a fluorocarbon film and a copper film in a test example, FIG. 3B shows a result of a peel test in a comparative example 1, and FIG. 3C shows a result of a peel test in a comparative example 2.

DETAILED DESCRIPTION OF THE EMBODIMENTS

Hereinafter, embodiments will be described with reference to the drawings.

Figure 1A:
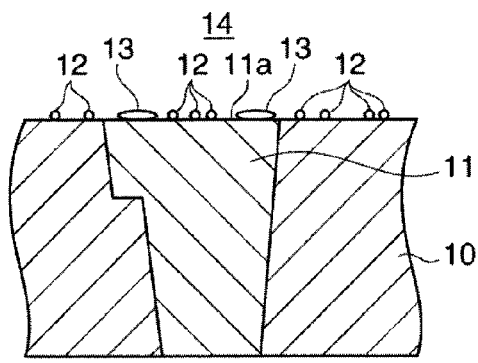
FIGS. 1A to 1C are process diagrams of a method for forming an insulating film according to an embodiment.
Figure 1B:
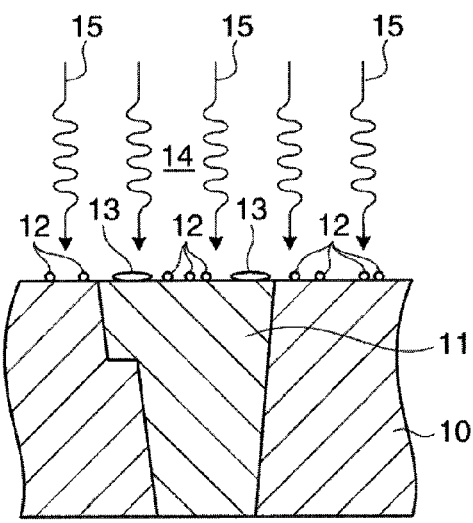
Figure 1C:
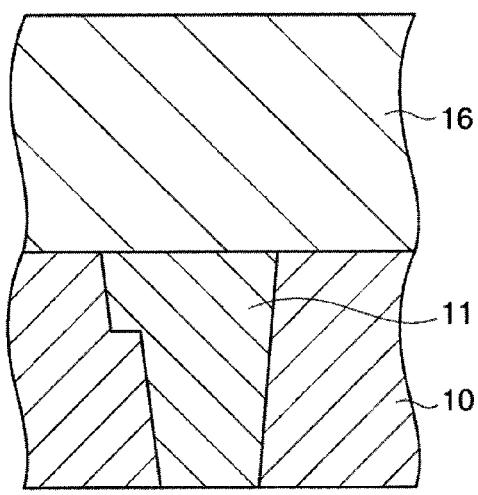

FIGS. 1A to 1C are process diagrams of a method for forming an insulating film according to an embodiment.

First, a semiconductor wafer having semiconductor devices formed thereon is provided in a processing chamber of a substrate processing apparatus capable of irradiating a microwave. The semiconductor device is an LSI having multilayer interconnection or the like and includes a first CF film 10 (another fluorocarbon-based insulating film) serving as an insulating film formed on an outermost surface thereof, and a copper wiring 11 buried in the first CF film 10. A part of the copper wiring 11 is exposed from the surface of the first CF film 10.

A planarization process is performed on the first CF film 10 and the copper wiring 11 by CMP (Chemical Mechanical Polishing). Therefore, moisture 12 from liquid chemical used in the CMP or moisture 12 in an atmosphere where the CMP is performed is adhered to the surface of the first CF film 10 or an exposed surface 11a of the copper wiring 11. Further, an extremely small amount of oxygen molecules (not shown) exist in a space 14 in the processing chamber where the exposed surface 11a of the copper wiring 11 is exposed, and copper atoms of the copper wiring 11 are coupled with (oxidized by) the oxygen molecules in the space 14.

Accordingly, a copper oxide 13 is formed at a part of the exposed surface 11a of the copper wiring 11 (see FIG. 1A).

Next, a hydrogen-containing atmosphere is generated by introducing hydrogen gas (not shown) into the space 14 and a microwave 15 is irradiated toward the first CF film 10 and the copper wiring 11 (see FIG. 1B). The microwave 15 heats molecules having polarity by dielectric loss. Therefore, the moisture 12 formed of water molecules that are polar molecules is heated by the microwave 15, while fluorocarbon forming the first CF film 10 is not easily heated due to its low dielectric constant. The metal does not have polar molecules and thus is also not heated by dielectric loss. Accordingly, the moisture 12 adhered to the surface of the first CF film 10 and the exposed surface 11a can be selectively heated by irradiating the microwave 15 toward the first CF film 10 or the copper wiring 11. As a result, only the moisture 12 can be removed by evaporation. The oxygen molecules in the space 14 are coupled with hydrogen molecules in the space 14 under a hydrogen-containing atmosphere, thereby generating water molecules (not shown) floating in the space 14. Since, however, a purge gas, e.g., nitrogen gas, is introduced into the space 14, the water molecules floating in the space 14 are involved in the purge gas to be discharged from the space 14. In other words, the oxygen molecules in the space 14 are coupled with hydrogen molecules to be removed. At this time, copper-hydrogen bonds are generated on the exposed surface 11 of the copper wiring 11 which is reduced as will be described later, by the reaction between copper atoms and hydrogen molecules.

Next, a CF-based gas, e.g., $C_5F_8$ (octafluorocyclopentene) gas, is introduced into the space without exposing the space 14 to an atmospheric air. Then, a plasma is generated by exciting the introduced $C_5F_8$ gas by a high frequency electric field. Thereafter, a second CF film 16 (fluorocarbon-based insulating film) is formed by plasma CVD (Chemical Vapor deposition) on the first CF film 10 and the copper wiring 11 to be in contact therewith (see FIG. 1C).

FIGS. 2A to 2E are process diagrams for explaining various reactions occurring on the exposed surface of the copper wiring in the method for forming an insulating film described in FIGS. 1A to 1C.

First, when the microwave 15 is irradiated toward the copper wiring 11 in a hydrogen-containing atmosphere (see FIG. 2A), the bond of the copper atoms and the oxygen atoms in the copper oxide 13 on the exposed surface 11a of the copper wiring 11 is excited by the microwave 15 so that the oxygen atoms are easily separated from the copper atoms. When the oxygen atoms are separated from the copper atoms, hydrogen atoms in the space 14 are coupled with the copper atoms (see FIG. 2B). In other words, when the microwave 15 is irradiated to the copper oxide 13, the oxygen atoms coupled with the copper atoms are replaced (reduced) by the hydrogen atoms. Accordingly, the microwave 15 promotes the reduction reaction of the copper oxide 13.

The separated oxygen atoms are coupled with another separated oxygen atoms to generate oxygen molecules or coupled with hydrogen atoms in a hydrogen-containing atmosphere of the space 14 to generate water molecules. The separated oxygen atoms have a high energy state, so that the oxygen molecules or the water molecules floats in the space 14 in a high energy state. The floating oxygen molecules or the floating water molecules are involved in the purge gas introduced into the space 14 and discharged from the space 14 (see FIG. 2B).

Figure 2A:
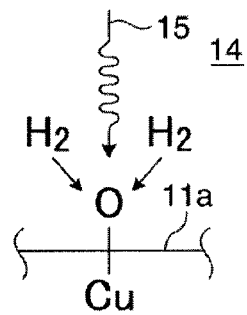
FIGS. 2A to 2E are process diagrams for explaining various reactions occurring on an exposed surface of a copper wiring in the method for forming an insulating film described in FIGS. 1A to 1C.
Figure 2B:
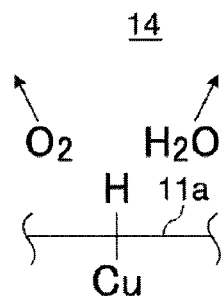
Figure 2C:
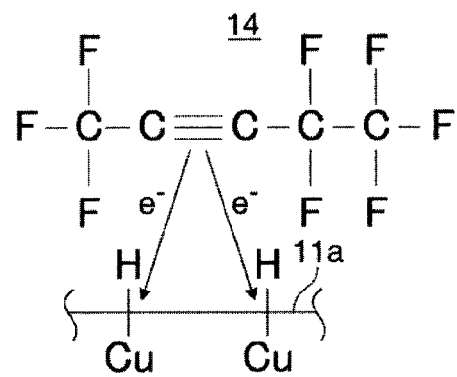
Figure 2D:
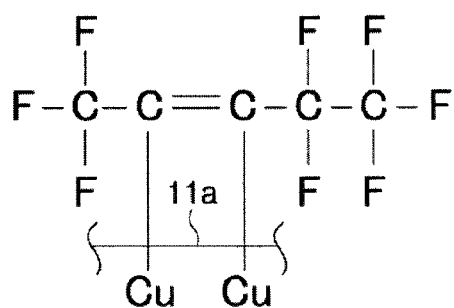
Figure 2E:
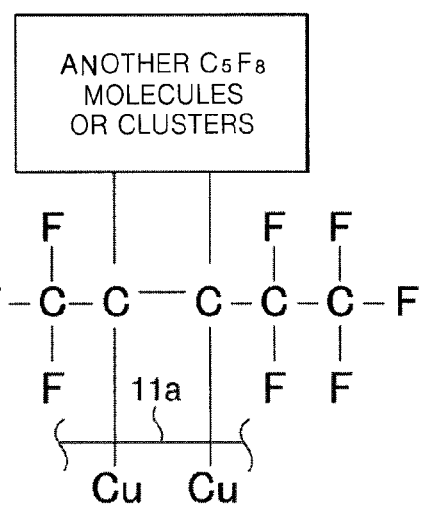

Next, $C_5F_8$ gas is introduced into the space 14 and excited by the electric field so that the second CF film 16 is formed on the copper wiring 11. At this time, bonding electrons are separated from a triple bond of carbon atoms in the second CF film 16 and provided to the bond between hydrogen atoms and copper atoms on the exposed surface 11a of the copper wiring 11 (see FIG. 2C). As a consequence, the hydrogen atoms are easily separated from the copper atoms. As a result, electron pairs of the bond between the carbon atoms in the second CF film 16 are coordinate-covalent-bonded with the copper atoms so that the bond between the copper wiring 11 and the second CF film 16 becomes strong (see FIG. 2D). Referring to FIG. 2D, a state in which $C_5F_8$ molecules of a single layer become in contact with and coupled to the copper wiring 11 is illustrated. However, as shown in FIG. 2E, $C_5F_8$ molecules of at least two layers may become in contact with and coupled to the copper wiring 11, or clusters of $C_5F_8$ molecules may become in contact with and coupled to the copper wiring 11. In that case as well, bonding electrons from the triple bond of carbon atoms in $C_5F_8$ molecules of a lowermost layer are provided to the bond between the copper atoms and the hydrogen atoms on the exposed surface 11a. Accordingly, electron pairs of the bond between the carbon atoms of the $C_5F_8$ molecules is coordinate-covalent-bonded with the copper atoms.

In the method for forming an insulating film according to the present embodiment, the microwave 15 is irradiated to the copper wiring 11 buried in the first CF film 10 and having the moisture 12 adhered thereon in the hydrogen-containing atmosphere, and the second CF film 16 is formed on the copper wiring 11 to which the microwave 15 is irradiated by plasma CVD using $C_5F_8$ gas. The microwave 15 heats the moisture 12 formed of water molecules that are polar molecules without heating the copper wiring 11 and the first CF film 10. Therefore, only the moisture 12 can be selectively heated and removed by evaporation. In other words, the heating efficiency for removing the moisture can be improved and the throughput can also be improved.

In the method for forming the insulating film according to the present embodiment, the moisture 12 is removed from the exposed surface 11a of the copper wiring 11 by heating. Further, the oxygen molecules in the space 14 are coupled with the hydrogen molecules in the space 14 to generate water molecules. The water molecules are involved in the purge gas and discharged from the space 14. Accordingly, the fluorination of the copper wiring 11 in the plasma CVD can be prevented and the generation of fluoride on the surface of the copper wiring 11 also can be prevented. As a result, the peeling off of the second CF film 16 formed on the copper wiring 11 can be suppressed.

In the method for forming the insulating film according to the present embodiment, the space 14 is not exposed to the atmospheric air from when the microwave 15 is irradiated toward the copper wiring 11 to when $C_5F_8$ gas is introduced into the space 14, so that the copper wiring 11 is not exposed to the atmospheric air. Accordingly, it is possible to prevent the moisture in the atmospheric air from being re-adhered to the exposed surface 11a of the copper wiring 11 from which the moisture 12 is removed by the irradiation of the microwave 15 and also possible to reliably prevent the fluorination of the copper wiring 11 in the plasma CVD.

In the method for forming the insulating film according to the present embodiment, the bond between the copper atoms and the oxygen atoms in the copper oxide 13 existing on the exposed surface 11a of the copper wiring 11 is excited by the microwave 15, so that the oxygen atoms are easily replaced (reduced) by the hydrogen molecules in the space 14. Therefore, the microwave 15 irradiated to the copper wiring 11 removes the moisture 12 adhered to the exposed surface 11a of the copper wiring 11 by heating and promotes the reduction reaction of the copper oxide 13.

In the method for forming the insulating film according to the present embodiment, the bonding electrons from the triple bond of carbon atoms in the second CF film 16 are provided to the bond between the hydrogen atoms and the copper atoms in the copper wiring 11, so that the hydrogen atoms are separated from the copper atoms in the copper wiring 11 and electron pairs of the bond between the carbon atoms in the second CF film 16 are coordinate-covalent-bonded with the copper atoms. As a result, the peeling off of the second CF film 16 from the copper wiring 11 can be reliably suppressed. In other words, the hydrogen molecules under the hydrogen-containing atmosphere of the space 14 remove the oxygen molecules in the space 14, so that the generation of a fluoride on the surface of the copper wiring 11 can be prevented and the adhesivity between the copper wiring 11 and the second CF film 16 can be improved.

In the method for forming the insulating film according to the present embodiment, since the copper wiring 11 is buried in the first CF film 10, the microwave 15 is irradiated to the first CF film 10 as well as the copper wiring 11. However, the fluorocarbon is not heated by the irradiation of the microwave 15 because it is a material having a low dielectric constant among low-k materials. Therefore, even if the copper wiring 11 to which the moisture 12 is adhered is buried in the first CF film 10, only the moisture 12 can be selectively heated. Accordingly, the heating efficiency for removing moisture can be reliably improved. Since the copper wiring 11 and the first CF film 10 are not heated, the increase in the temperature of the entire semiconductor device is prevented and a thermal stress applied to the semiconductor wafer is suppressed. Also, it is possible to prevent the quality deterioration of the semiconductor device due to a transmutation of the first CF film 10 by a reaction with another element, for example, without increase of the dielectric constant due to disconnection of covalent-bonding of the carbon atoms in the fluorocarbon and bonding of hydroxyl base to the carbon atoms. Moreover, since the first CF film 10 is not heated, the first CF film 10 is not thermally contracted and the shrinkage of the semiconductor device can be suppressed.

While the disclosure has been described, the disclosure is not limited to the above-described embodiment.

For example, in the above-described embodiment, the copper wiring 11 is used as the metal wiring. However, the disclosure may be applied to the case of using another metal wiring that generates a fluoride. The fluorocarbon film may be formed by using another CF-based gas other than $C_5F_8$ gas.

In the above-described embodiment, it is assumed that the irradiation of the microwave 15 to the copper wiring 11 and the formation of the second CF film 16 on the copper wiring 11 are carried out in the processing chamber of the same substrate processing apparatus. However, the irradiation of the microwave 15 to the copper wiring 11 and the formation of the second CF film 16 on the copper wiring may be carried out in different substrate processing apparatuses. In that case, it is desirable to prevent the semiconductor wafer to be exposed to the atmospheric air when the semiconductor wafer is moved from a substrate processing apparatus in which the irradiation of the microwave 15 is carried out to a substrate processing apparatus in which the formation of the second CF film 16 is carried out.

The object of the disclosure can also be realized by providing a storage medium in which program codes of software that realize the functions of the above-described embodiments are stored in a computer (not shown) of the substrate processing apparatus, and causing a CPU of the computer to read out and execute the program codes stored in the storage medium.

In this case, the program codes themselves read out from the storage medium realize the functions of the above-described embodiments and, thus, the program codes and the storage medium in which the program codes are stored constitute the disclosure.

The storage medium for supplying the program codes may be, e.g., a RAM, a NVRAM, a floppy (registered trademark) disk, a hard disk, a magneto-optical disk, an optical disk such as CD-ROM, CD-R, CD-RW, DVD (DVD-ROM, DVD-RAM, DVD-RW, DVD+RW), a magnetic tape, a non-volatile memory card, a ROM or the like which may store the program codes. Alternatively, the program codes may be downloaded from another computer, database or the like (not shown) connected to the Internet, a commercial network or a local area network and then supplied to the computer.

The functions of the above-described embodiments may be realized not only by executing the program codes read out by the computer but also by causing an OS (operating system) or the like which operates in the CPU to perform a part or all of actual operations based on instructions of the program codes.

The functions of the above-described embodiments may also be realized by storing the program codes read out from the storage medium in a memory provided for a functional extension board inserted in the computer or a function extension unit connected to the computer and then causing the CPU provided for the functional extension board or the function extension unit to perform a part or all of the actual operations based on the instructions of the program codes.

The program codes may be object codes, program codes executed by an interpreter, script data supplied to the OS, or the like.

Test Examples

Hereinafter, test examples of the disclosure will be described.

First, a CF film was formed on a semiconductor wafer and a microwave was irradiated to the CF film to remove only moisture adhered to a surface of the CF film by heating. Next, a copper film was formed on the CF film by PVD (Physical Vapor Deposition) or the like without exposing the semiconductor wafer to the atmospheric air. Then, the copper film was covered by a titanium film and a SiCN film (a silicon nitrocarbide film). The microwave was irradiated for one minute (test example).

A CF film was formed on the semiconductor wafer. Then the entire semiconductor wafer mounted on a stage was heated by a heater installed in the stage to 370° C. to remove moisture adhered to the surface of the CF film. Next, a copper film was formed on the CF film by PVD or the like without exposing the semiconductor wafer to the atmospheric air. Thereafter, the copper film was covered by a titanium film and a SiCN film. At this time, the entire semiconductor wafer was heated by the heater for five minutes (comparative example 1).

A CF film, a copper film, a titanium film and a SiCN film were formed on the semiconductor wafer under the condition as that of the comparative example 1 except the time of heating the entire semiconductor substrate by the heater. In this example, the semiconductor wafer was heated by the heater for 15 minutes (comparative example 2).

Figure 3A:
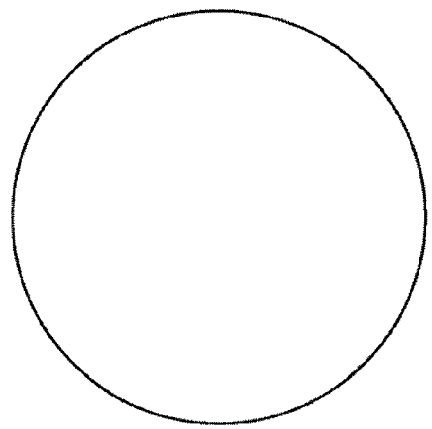
Figure 3B:
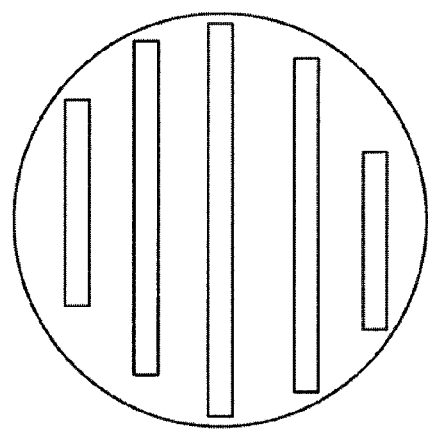
Figure 3C:
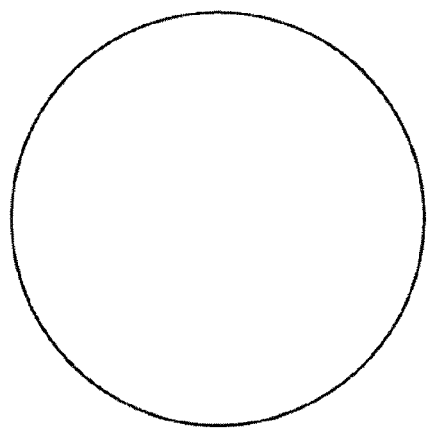
Figure 4A:
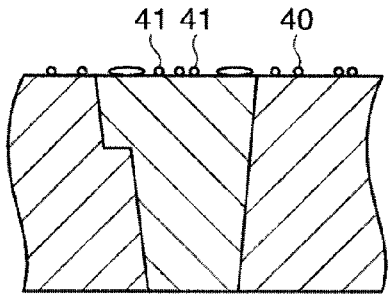
FIGS. 4A to 4C are process diagrams of a conventional method for forming an insulating film.
Figure 4B:
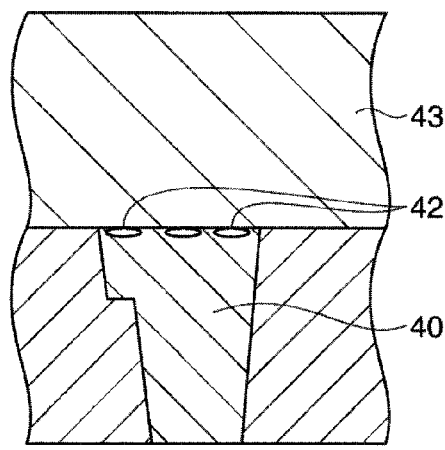
Figure 4C:
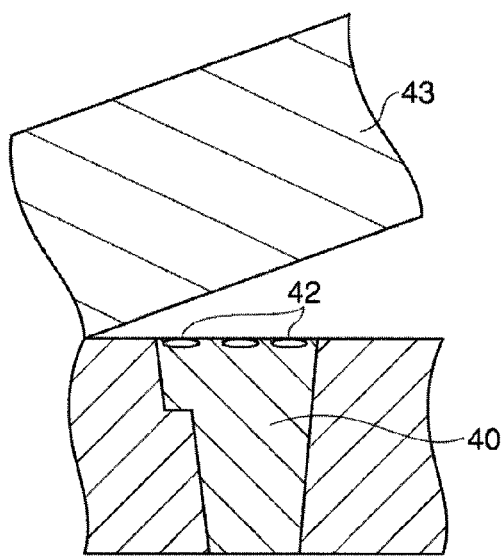

Then, the peel test was performed by adhering a tape to the SiCN film in the test example, the comparative example 1 and the comparative example 2. As a result, in the test example (see FIG. 3A) and the comparative example 2 (see FIG. 3C), the peeling off of the copper film from the CF film did not occur. On the other hand, in the comparative example 1 (see FIG. 3B), the peeling off of the copper film from CF film occurred and a stripe-shaped mark of the peeling off which corresponds to the shape of the tape was found on the surface of the semiconductor wafer. The reason that the copper film was peeled off from the CF film is because the moisture adhered to the surface of the CF film was not completely removed and a fluoride was generated on the copper film that was brought into contact with the CF film when the copper film was formed.

It has been found from the result of the peel test using the tape in the comparative examples 1 and 2 that the entire semiconductor wafer needs to be heated by the heater for a comparatively long period of time (e.g., about 15 minutes or more) in order to completely remove moisture adhered to the surface of the CF film. If not, the heating efficiency for removing the moisture is poor and the throughput is decreased.

It has been found from the result of the peel test using the tape in the test example and the comparative example 2 that the irradiation of the microwave for a short period of time provides the effect of suppressing the peeling off of the copper film which is substantially the same as that obtained when the entire semiconductor wafer is heated for a comparatively long period of time. In other words, the irradiation of the microwave can improve not only the heating efficiency for removing moisture but also the throughput.

Further, it has been found from the result of the peel test using the tape in the test example and the comparative example 1 that the irradiation of the microwave can suppress the peeling off of the CF film and the copper film.

While the disclosure has been shown and described with respect to the embodiments, it will be understood by those skilled in the art that various changes and modifications may be made without departing from the scope of the disclosure as defined in the following claims.

What is claimed is:

1. A method for forming a fluorocarbon-based insulating film in contact with a metal, the method comprising:
   removing moisture adhering to the metal by irradiating microwave to the metal in a hydrogen-containing atmosphere; and
   performing plasma chemical vapor deposition (CVD) using a fluorocarbon-based gas on the metal to which the microwave is irradiated to form the fluorocarbon-based insulating film.

2. The method of claim 1, wherein the microwave is irradiated and the plasma CVD is performed without exposing the metal to atmospheric air.

3. The method of claim 1, wherein an oxide of the metal exists on the metal before the irradiating the microwave.

4. The method of claim 2, wherein an oxide of the metal exists on the metal before the irradiating the microwave.

5. The method of claim 1, wherein the metal is buried in another fluorocarbon-based insulating film and a part of the metal is exposed.

6. The method of claim 2, wherein the metal is buried in another fluorocarbon-based insulating film and a part of the metal is exposed.

7. The method of claim 3, wherein the metal is buried in another fluorocarbon-based insulating film and a part of the metal is exposed.

8. The method of claim 4, wherein the metal is buried in another fluorocarbon-based insulating film and a part of the metal is exposed.

9. The method of claim 1, wherein the metal is copper.

10. The method of claim 2, wherein the metal is copper.

11. The method of claim 3, wherein the metal is copper.

12. The method of claim 4, wherein the metal is copper.

13. The method of claim 5, wherein the metal is copper.

14. The method of claim 6, wherein the metal is copper.

15. The method of claim 7, wherein the metal is copper.

16. The method of claim 8, wherein the metal is copper.

17. A method for manufacturing a semiconductor device having a fluorocarbon-based insulating film in contact with a metal, the method comprising:
   removing moisture adhering to the metal by irradiating a microwave to the metal in a hydrogen-containing atmosphere; and
   performing plasma chemical vapor deposition (CVD) using a fluorocarbon-based gas on the metal to which the microwave is irradiated to form the fluorocarbon-based insulating film.

18. The method of claim 1, wherein the microwave selectively heats the moisture without heating the metal.

19. The method of claim 17, wherein the microwave selectively heats the moisture without heating the metal.

* * * * *